(12) United States Patent
Wong

(10) Patent No.: US 7,125,772 B2
(45) Date of Patent: Oct. 24, 2006

(54) NONVOLATILE MEMORY

(75) Inventor: Ting-Wah Wong, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 914 days.

(21) Appl. No.: 09/919,003

(22) Filed: Jul. 31, 2001

(65) Prior Publication Data

US 2002/0027804 A1    Mar. 7, 2002

Related U.S. Application Data

(60) Continuation-in-part of application No. 09/440,360, filed on Nov. 15, 1999, now Pat. No. 6,088,263, which is a division of application No. 09/189,249, filed on Nov. 10, 1998, now Pat. No. 6,026,017, which is a continuation-in-part of application No. 08/838,854, filed on Apr. 11, 1997, now Pat. No. 5,867,425.

(51) Int. Cl.
*H01L 21/336* (2006.01)

(52) U.S. Cl. .................. 438/262; 438/263; 438/264
(58) Field of Classification Search ............. 438/257, 438/262–264; 257/315, 320, 322
See application file for complete search history.

(56) References Cited

U.S. PATENT DOCUMENTS

| | | | | |
|---|---|---|---|---|
| 6,088,263 | A | * | 7/2000 | Liu et al. .............. 365/185.05 |
| 6,114,724 | A | * | 9/2000 | Ratnakumar ............... 257/326 |
| 6,624,026 | B1 | * | 9/2003 | Liu et al. ..................... 438/264 |

* cited by examiner

*Primary Examiner*—Hsien-Ming Lee
(74) *Attorney, Agent, or Firm*—Martine Penilla & Gencarella, LLP

(57) ABSTRACT

A nonvolatile memory cell that is highly scalable includes a cell formed in a triple well. A pair of sources for a pair of cells on adjacent word lines each acts as the emitter of a lateral bipolar transistor. The lateral bipolar transistor of one cell operates as a charge injector for the other cell. The charge injector provides carriers for substrate hot carrier injection onto a floating gate.

8 Claims, 10 Drawing Sheets

NONVOLATILE MEMORY

This is a continuation-in-part of U.S. patent application Ser. No. 09/440,360 filed Nov. 15, 1999, now U.S. Pat. No. 6,088,263, which is a division of U.S. patent application Ser. No. 09/189,249 filed Nov. 10, 1998, now U.S. Pat. No. 6,026,017, which is a continuation-in-part of U.S. application Ser. No. 08/838,854 filed Apr. 11, 1997, now U.S. Pat No. 5,867,425.

BACKGROUND

This invention relates generally to nonvolatile memories and particularly to electrically erasable nonvolatile memories.

Nonvolatile memory cells are advantageous since they retain recorded information even when the power to the memory is turned off. There are several different types of nonvolatile memories including erasable programmable read only memories (EPROMs), electrically erasable and programmable read only memories (EEPROMs) and flash EEPROM memories. EPROMS are erasable through light exposure but are electrically programmable by channel hot electron injection onto a floating gate. Conventional EEPROMs have the same programming functionality, but instead of being light erasable they can be erased and programmed by electron tunneling facilitated by an on-chip electrical signal. Thus, information may be stored in these memories, retained when the power is off, and the memories may be erased for reprogramming, as necessary, using appropriate techniques. Flash EEPROMs may be block erased, typically giving them better read access times than regular EEPROMs.

Currently, flash memories have gained considerable popularity. For example, flash memories are often utilized to provide on-chip memory for microcontrollers, modems and SMART cards and the like where it is desirable to store codes that may need fast updating.

While flash memories and EEPROMs are closely related, in many instances, flash memories are preferred because their smaller cell size means that they can be made more economically. However, flash memories and EEPROMs often have very similar cell attributes.

Nonvolatile memory cells differ in certain respects from the transistors that are generally utilized in electronic components called logic devices, such as microcontrollers, that work with the memory cells. Logic devices are formed of transistors that use a single gate electrode. Nonvolatile memories usually include two gate electrodes, known as the control and floating gate electrodes, situated one adjacent to the other. Because of this structural difference, nonvolatile memories and logic devices may be made by different processes. This may contribute to a substantial increase in process complexity and manufacturing cost when the two components need to be placed together into the same chip.

Particularly with an EEPROM, the electrical programming of the cells normally requires substantial potentials to be applied to the cells. These potentials induce electron tunneling from an N+region onto the floating gate. Additional complexity may arise from the need to provide substantially larger voltages to memory cells than are needed for normal logic transistor operation.

While the industry has come to accept the need for separate process technologies for logic and nonvolatile memories and while those in the industry have also come to appreciate that significant currents are needed to program flash EEPROMs, there would be a substantial demand for a nonvolatile memory which was both electrically erasable and programmable without the need for special process technologies or for relatively higher programming voltages and higher currents.

Furthermore, with the conventional flash EEPROMs, the electrical programming of the cells normally requires high current to be applied to the cells. A very minute fraction of this electron current becomes injected from the drain depletion region onto the floating gate. This means that the injection efficiency of such devices is low (e.g., $1 \times 10^{-6}$ to $1 \times 10^{-9}$). The requirement of high current adds additional complexity because of the design of the high current pump operated at low voltage.

DETAILED DESCRIPTION

Figure 1:
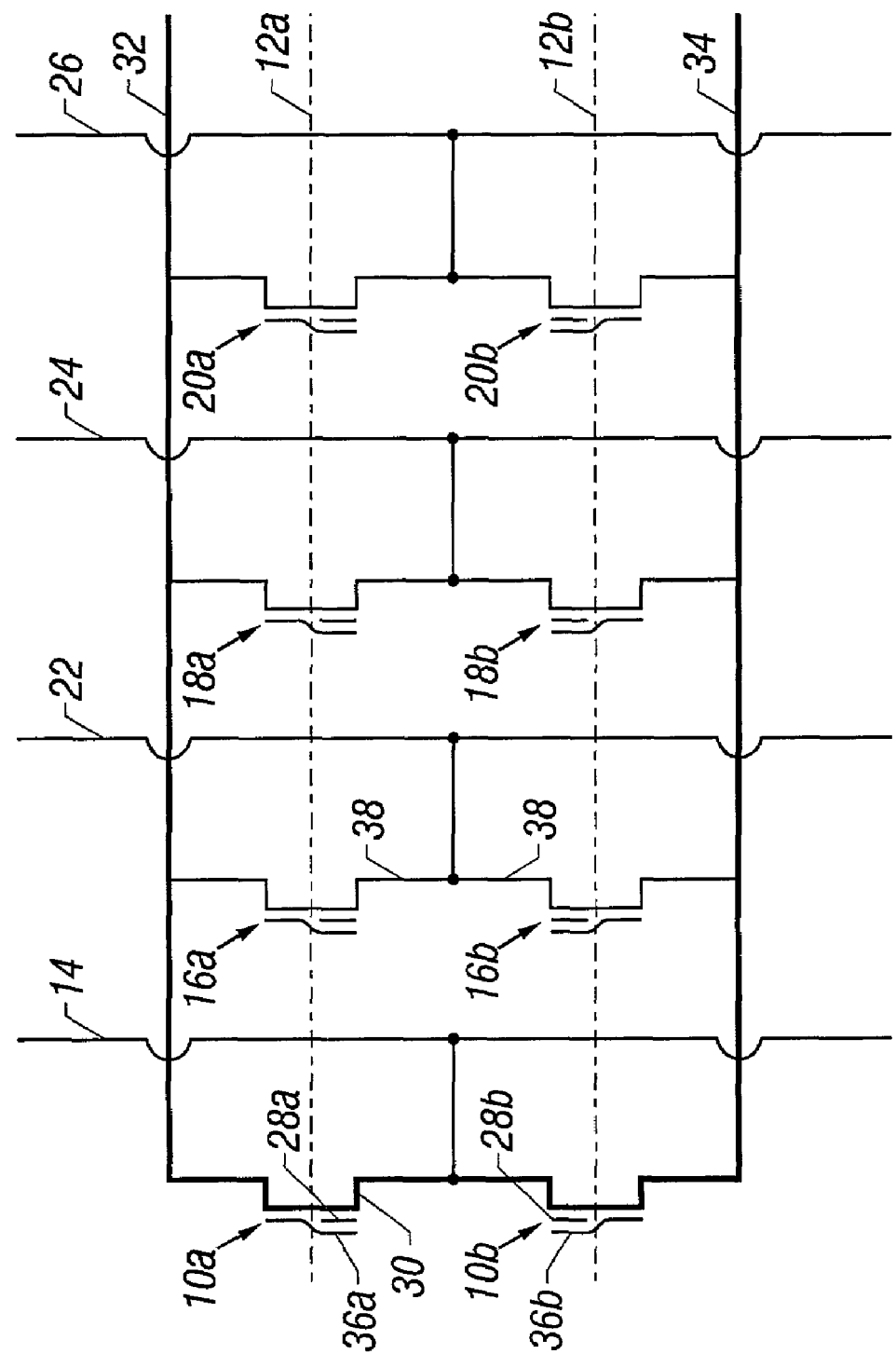
FIG. 1 is a schematic depiction of an array configuration for one embodiment.

Referring to the drawing wherein like reference characters are used for like parts throughout the several views, a pair of memory cells 10a and 10b, shown in FIG. 1, are located in two adjacent word lines 12a and 12b. The cells 10 are both arranged on the same bit line 14. Other cells 16, 18, and 20 are arranged on bit lines 22, 24, and 26 and word lines 12. This structure is advantageously implemented on a semiconductor layer having situated thereon electrically isolated floating gates 28.

The source terminal 30 of each cell 10, 16, 18 and 20 is controlled by a source 32 or 34. The control gates 36a and 36b of the cells 10, 16, 18 and 20 are controlled by the word lines 12. The drains 38 of the cells are connected to the bit lines 14, 22, 24 and 26.

Figure 3:
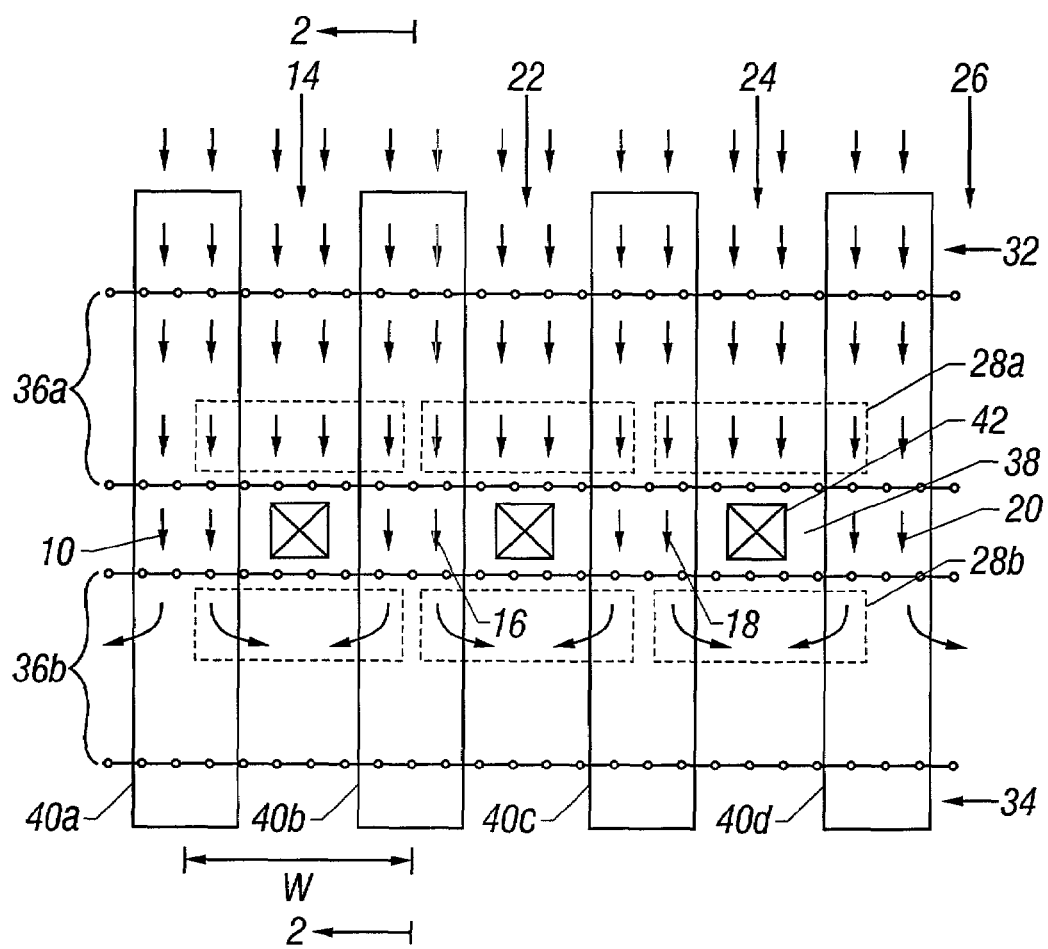
FIG. 3 is a greatly enlarged, top plan view showing the layout of a semiconductor implementation of the embodiment shown in FIG. 1.

One layout for implementing a pair of cells 10, shown in FIG. 3, includes a pair of control gates 36a and 36b. The same layout may be used for the other pairs of cells 16, 18 and 20. The control gates 36 extend across a field oxide isolation region 40 that is bordered by the drain 38 on one side and the source 32 and 34 on the other side. The floating gates 28a and 28b are situated in isolation under the control gates 36a and 38a, over the oxide isolation region 40a.

Figure 2:
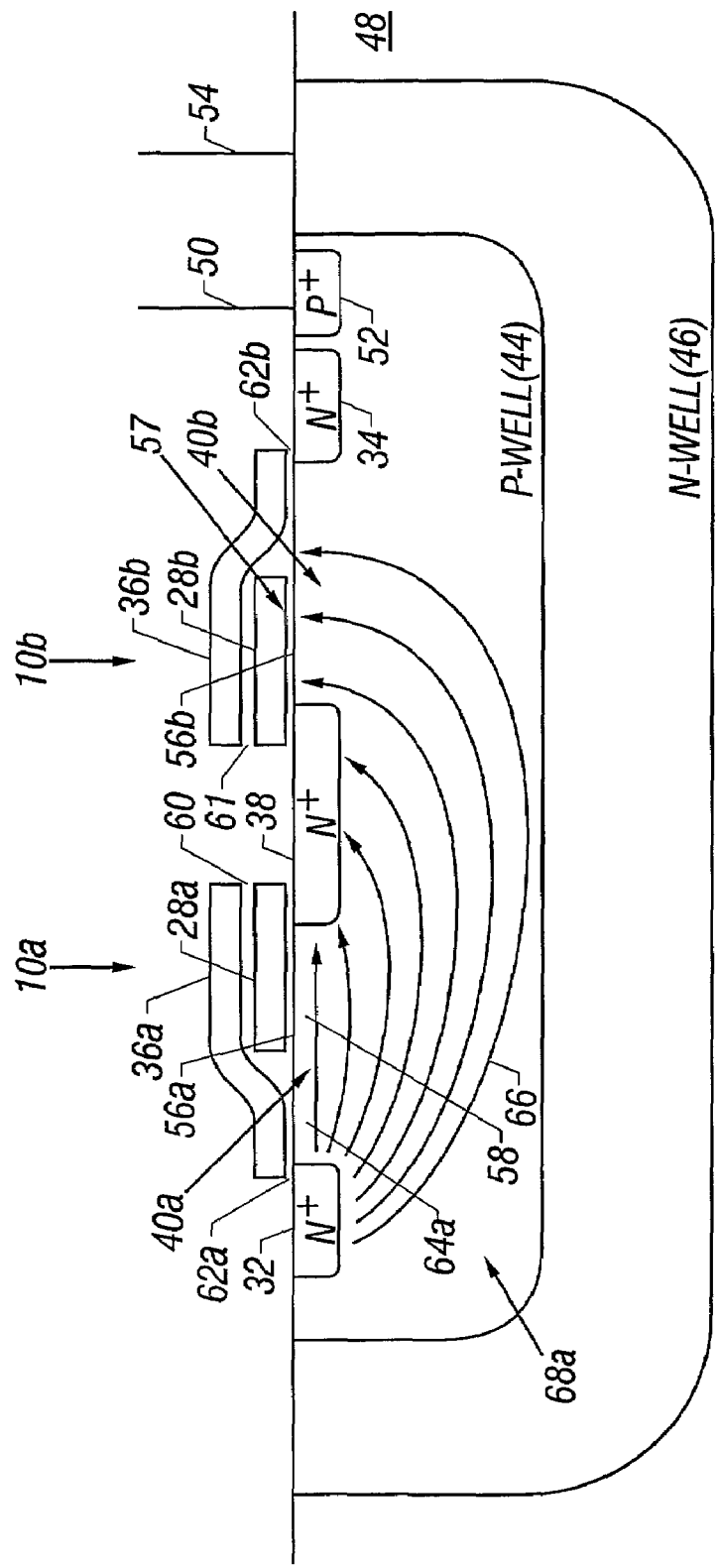
FIG. 2 is a cross-sectional view taken generally along the line 3—3 in FIG. 3.

In the embodiment illustrated in FIG. 2, the active areas under the bit lines are P-type semiconductor material and are part of a P-well 44. The P-well 44 in turn is formed in an N-well 46. Finally, the N-well 46 is formed in a P-type substrate 48. The P-well 44 may be biased, as indicated at 50 through a heavily doped P-type contact 52, and the N-well 46 may be biased, as indicated at 54.

Each floating gate 28 forms a tunneling capacitor 57 by its interaction with the channel 58. A tunnel dielectric 56 separates the floating gate 28 from the channel 58. Similarly the interpoly dielectric 60 which is part of a coupling capacitor 61, separates the floating gate 28 from the control gate 36. Finally, the control gate 36 is separated by the dielectric 62 from the channel 64.

The physical relationship of the cells 10, 16, 18 and 20 is illustrated in FIG. 3. The floating gates 28 are shown in dashed lines. Similarly, the control gates 36 span between the drain 38 and a source 32 or 34. Drain contacts 42 are located between the control gates 36 and bit lines 14, 22, 24 and 26. Bit lines 14, 22, 24 and 26 extend transversely to the control gates 36.

The cell 10 may be described as a flash EEPROM utilizing high efficiency substrate hot electron injection for erasure and Fowler-Nordheim tunneling for programming. The process of substrate hot electron injection is well described in T. H. Ning, C. M. Osburn, and H. W. Yu, "Emission Probability of Hot Electrons from Silicon into Silicon Dioxide," J. Appl. Phys., vol. 48, p. 286 (1977); Boaz Eitan, James L. McCreary, Daniel Amrany, Joseph Shappir, "Substrate Hot-electron Injection EPROM," IEEE Transactions on Electron Devices, Vol. ED-31, No. 7, p. 934 (July 1984); I. C. Chen, C. Kaya, and J. Paterson, "Band-to-Band Tunneling Induced Substrate Hot-electron (BBISHE) Injection: A New Programming Mechanism for Nonvolatile Memory Devices," IEDM (1989) p. 263; and C. Y. Hu, D. L. Kencke, S. K. Benerjee, "Substrate-current-induced Hot Electron (SCIHE) Injection: A New Convergence Scheme for FLASH Memory," IEDM (1995), P. 283. Each of these articles is hereby expressly incorporated by reference herein.

The cells are erased by causing charge to accumulate on the floating gates 28 and programming is achieved when charge is removed from the floating gates. Thus, initially all of the cells have accumulated charges on their floating gates. All of the cells 10, 16, 18, and 20 are erased together using block erasing.

Erasing is achieved by high efficiency substrate hot carrier injection. As indicated in FIG. 2, substrate carriers such as the electrons, indicated by the arrows at 66, may be generated by forward biasing a source 32 or 34. That is, the source of one cell acts as the injector for the other cell of a pair of cells 10, 16, 18, or 20. Thus, the source 32 acts as an injector for the cell 10b being erased in FIG. 2. Similarly, the source 34 acts an injector for the cell 10a when the cell 10a is being erased.

The source 32 is separated from the cell 10b by the channels 64a and 58 and the drain 38. Some of the substrate electrons 66 diffuse through these regions to the channel region 56b underneath the cell 10b. Some electrons are ineffectively taken by the drain 38.

For cells that need to be erased, the channel region 56 may be biased such that a depletion region is formed. When an electron gets to the depletion region, it is accelerated by an electric field, $V_{CS}$. The electric field $V_{CS}$ is the difference between the channel potential (potential of the surface inversion region) and the P-well 44 potential. Some of these electrons gain sufficient energy, in excess of the effective oxide barrier height potential, to be injected onto the floating gate 28b.

For cells that are not to be erased, the channel-to-P-well potential is less then the effective oxide barrier height. In such case, the electrons would not gain sufficient energy to overcome the barrier height and are not injected onto the floating gate 28.

Figure 5:
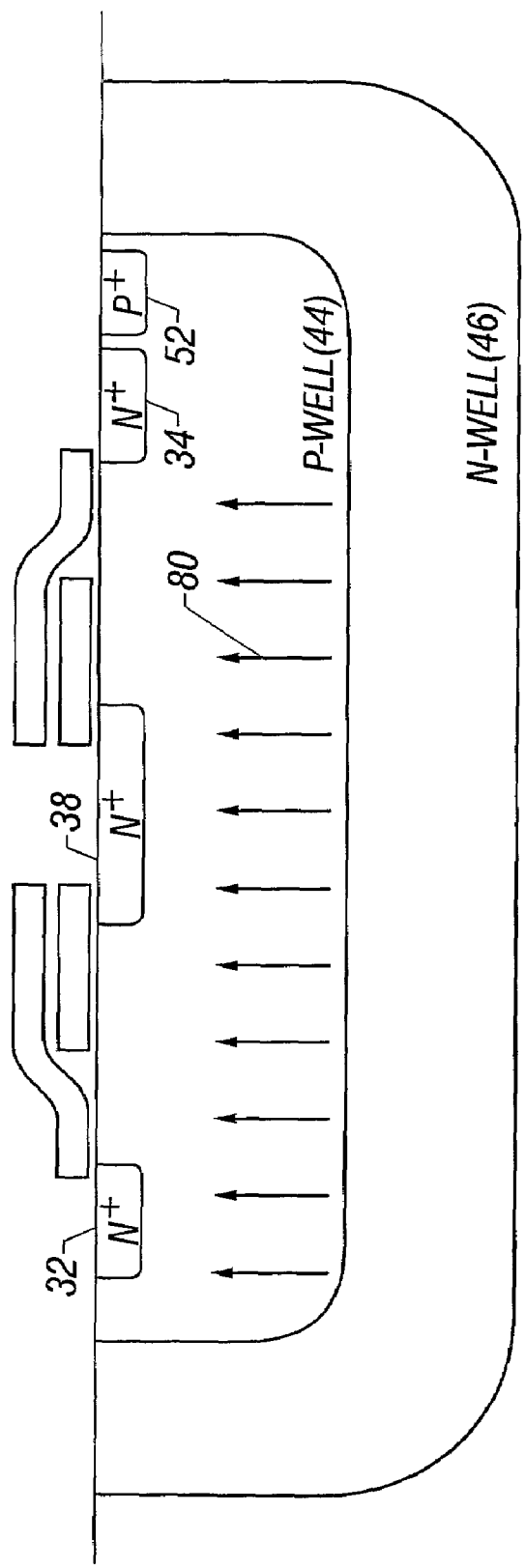
FIG. 5 is a cross-sectional view of another embodiment.

In the case when flash erase is desired, a scheme exists where all the cells inside the same P-well can be erased together. This is achieved by forward-biasing the P-well 44 with respect to the N-well 46. Electrons are injected from the bottom of the P-well 44 as indicated by the arrows 80, and are collected by either the floating gate or the drain as shown in FIG. 5.

The heavily doped N-type source 32, the P-type regions 64a and 56a under the cell 10a, the region under the drain 38 and the cell 10b channel 56b, form a lateral bipolar transistor 68. The emitter (source 32) of the bipolar transistor 68 acts as a charge injector, injecting substrate electrons from the source to the biased depletion region under the floating gate 28b. With the source 32 as the emitter and the channels 68a, 56a and the region under the drain 38 as the base, the collector is the biased depletion region 56b.

A compact cell layout is achieved because separate select transistors are unnecessary and the drain 38 acts as the drain for two adjacent cells in a pair of cells. The source of one cell also acts as the efficient injector for the other cell of a pair.

The efficiency of substrate hot electron injection is a function of a number of characteristics. Considering the depletion region 56b, electrons scatter with lattice phonon scattering across the depletion region with a certain electron mean free path. Some of these electrons, without much scattering, gain sufficient energy to overcome the effective barrier height and are injected onto the floating gate 28. Some electrons gain less energy than the effective barrier height and are not injected onto the floating gate 28. The injection efficiency is a strong function of the doping concentrations and the channel-to-P-well potential, $V_{CS}$.

Since the cell 10 is situated in a P-well 44 embedded in an N-well 46, during erasing the floating gate 28 is capacitively coupled to a high voltage by raising the potential on the bit lines, which may be biased to a potential from 7 to 14 volts. The voltage that the floating gate 28 attains at low drain bias is approximately a function of the voltage on the floating gate when the control gate 36b and the P-well 44 and drain 38 are at ground, plus the coupling ratio times the voltage on the control gate 36b. The coupling ratio, to a first order, is approximately equal to the capacitance of the coupling capacitor 61 divided by the sum of the capacitances of the coupling capacitor 61 and the tunneling capacitor 57.

When the cell 10a is off, the drain 38 potential can be forced close to the supply potential $V_{CC}$ or higher. The channel 56b potential, which is the potential of the surface inversion region of the channel region, is set as follows. When the potential of the floating gate 28 (Vfg) is one cell threshold voltage higher than the drain 38 potential, the channel potential is the same as the drain potential. On the other hand, when the floating gate 28 potential is less than the drain 38 potential plus the cell threshold voltage, the channel potential is the difference between the floating gate 28 voltage and the cell threshold voltage.

The P-well potential is the voltage 50 applied to the P-well 44. The P-well 44 is embedded in an N-well 46, and the N-well is set at a voltage 54 of approximately $V_{SS}$ or higher, such as $V_{CC}$. Thus, the P-well potential can be $V_{SS}$ or negative, typically negative one to negative two volts. Moreover, P-well potential is usually less than the effective oxide barrier height to avoid any potential disturb problem.

The potential difference between the channel 56*b* region and the P-well 44 potential 50 is the voltage across the depletion region. For cells to be erased, the drain 38 voltage is raised high, typically close to $V_{CC}$ or higher. A depletion region underneath the cell being erased is formed with a voltage drop equal to the channel potential minus the P-well potential 50.

For those cells that are not to be erased, the unselected word line voltage may be set to zero volts ($V_{SS}$). The voltage drop across the depletion region then is less than the effective oxide barrier height.

Cell 10 programming is achieved by Fowler-Nordheim tunneling of electrons from the floating gate 28 to the channel region 56*b* and the drain 38. During programming, the selected bit line 36*b* is forced to a high voltage "H" (higher than $V_{CC}$) of about 5 volts, for example. The unselected bit lines are maintained at $V_{SS}$ (external ground). If the N-well and P-well are maintained at Vcc and $V_{SS}$ respectively, the electric field across the junction between the drain 38 and the P-well 44 may be reduced. The reduced field prevents acceleration of hot hole trapping in the gate oxide under the floating gate 28. Electrons tunnel to the drain 38 (drain programming). The tunneling current depends on the voltage from the floating gate 28 to the drain 38.

Reading the programming state of a cell may be accomplished as follows. The selected bit line is biased to approximately 0.7 to one volt. The rest of the bit lines are allowed to float. The source 32 may be biased to $-V_S$ and the source 34 may be biased to $V_{SS}$. The selected word line is biased to $V_{HH}$ and the adjacent word line is biased to $V_{SS}$. The P-well is biased to $V_{SS}$ and the N-well is biased at $V_{CC}$.

When these potentials are applied to the selected cell 10, a current flows through the cell. This current is then fed to a current sense amplifier (not shown). If the voltage on the floating gate 28 is greater than the threshold voltage on the sense transistor 12, a higher current, perhaps greater than 20 microamps, is detected as the conducting state. When the potential of the floating gate is less than the threshold voltage, a lower current, for example, less than one microamp flows, and a nonconducting state is detected.

A detected conducting state can be called a one state. A nonconducting state can be called the zero state.

During erasing, the source 32 is biased to $-V_S$ (i.e., a diode voltage drop, approximately 0.7 volts, for example) while the source 34 is at $V_{HH}$. $V_{HH}$ may be from about 10 to 14 volts in one embodiment. The selected word line is biased to $V_{HH}$ and the adjacent word line of the pair is $-V_S$. The P-well bias is $-V_{SS}$ and the N-well bias is $V_{CC}$.

The voltage across the capacitor 57 is the difference between the floating gate 28 potential on the one hand and the drain 38 and the P-well 44 potentials. When the difference exceeds 8 to 10 volts, sufficient tunneling current is generated and the floating gate 28 can be erased to a negative potential in the time frame of a few milliseconds to a few seconds, depending on the tunneling oxide 56 thickness.

A suitable on-chip circuit for generating two negative bias potentials, one to bias a word line 36 and the other to negatively bias the P-well 44, can be found in L. A. Glasser and D. W. Dobberpuhl, "The Design and Analysis of VLSI Circuits," (December 1985), published by Addison-Wesley, at pages 301–329, hereby expressly incorporated by reference herein.

The cells in the array may be formed using conventional process technologies such as double poly, single metal CMOS process. The illustrative parameters set forth herein contemplate a 0.25 m or lower feature size with $V_{CC}$ potentials of 1.8 volts. As the technology permits lowering voltages and smaller feature sizes, the parameters herein would scale accordingly.

The starting substrate material is typically P-type (100) silicon, for example having a resistivity in the range of 10–20 ohm-cm. The P-well 44 is embedded in an N-well 46 in the so-called triple well process. The P-well 44 has a typical well depth of, for example, 2 to 4 um with an average doping concentration, for example, in the range of $1\times10^{16}$ to $5\times10^{16}$ atoms per cubic centimeter.

The N-well 46 has a typical well depth of, for example, 4–8 um. The doping concentration may be from $4\times10^{15}$ to $1\times10^{16}$ atoms per cubic centimeter. The triple well is formed by the P-well 44 counterdoping the N-well 46.

The formation of the elements in the triple well is as follows. An N-well implant is done, for example, with phosphorous 31 with a typical dose of 1 to $1.5\times10^{13}$ atoms per square centimeter and an energy of 160 to 100 Kev. The N-well 46 is then counterdoped with a P-well implant. Typical dosages for the P-well implant could be 1.5 to $2.5\times10^{13}$ atoms per square centimeter with an energy of 30 Kev to 180 Kev using a species such as boron 11. The N-well 46 and P-well 28 are then driven, typically 6 to 10 hours at 1125 to 1150° C. This sets the wells to the desired doping concentrations and depths.

After the well formation, standard logic field oxide formation and channel stop formation steps are applied. The field oxide thickness and implant doses are adjusted to achieve a field threshold of 7 to 14 volts, which is determined by the level for programming and erasing and by logic process capability. After this formation, a memory cell implant may be performed. For example, a B11 implant at 30 to 50 Kev with a dose of 1.5 to $3\times10^{13}$ atoms per square centimeter may be done through a sacrificial oxide. The gate oxide 62*a* and the tunnel oxide 56 are then formed. For example, an 85 to 100 Angstrom dry oxide may be grown across the wafer. A dry oxide is grown, for example, at 900° C. in partial oxygen followed by a 975 to 1050° C. anneal.

The floating gate 28 may then be formed of polysilicon, silicide or metals. If polysilicon is used, it can be 1600 Angstroms thick, and POCL3 doped at 870 to 1000° C. The interpoly dielectric is formed of an oxide-nitride-oxide sandwich (ONO) with the lower oxide being from 60 to 80 Angstroms, the nitride layer having a thickness of from 90 to 180 Angstroms and the upper oxide being from 30 to 40 Angstroms.

Figure 6:
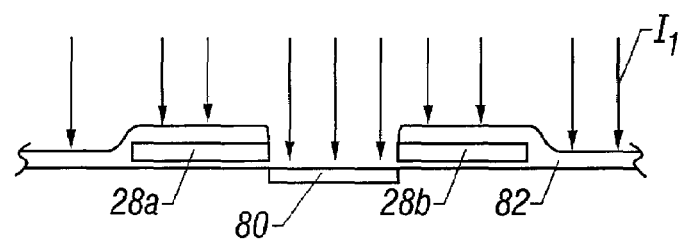
FIG. 6 is a greatly enlarged cross-sectional view of the drain implant.

After floating gate 28 definition, an N+ implant $I_1$ is implanted into the drain side of the device, as shown in FIG. 6. The implant $I_1$ may be subjected to prolonged temperature cycles to form the memory junction. The N+ implant can be, for example, a phosphorous implant at 60 Kev, at a dose of 1 to $3\times10^{14}$ atoms per square centimeter and may be followed by an arsenic implant at 60 Kev, 2.5 to $4.5\times10^{15}$ atoms per square centimeter. It is also possible to form the source and drain using lightly doped drain (LDD) technology.

Figure 7:
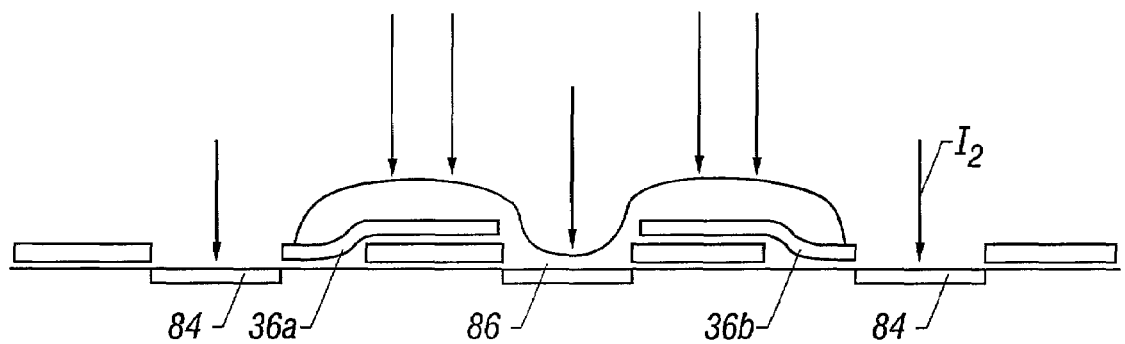
FIG. 7 is a greatly enlarged cross-sectional view of the source implant.

The polysilicon (poly 2) for the control gate may then be deposited and silicided if desired. The control gate need not be aligned to either edge of the floating gate. The control gate may be self-aligned to the source, as shown in FIG. 7. The gates are patterned and defined. The control gate need not be self-aligned to the floating gate on the source or the drain sides.

Figure 8:
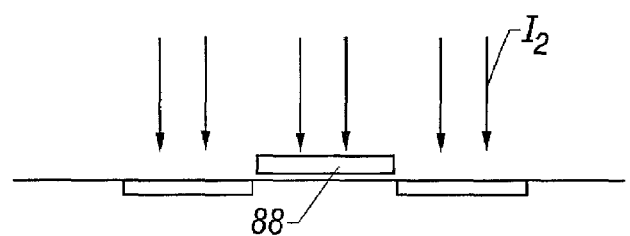
FIG. 8 is a greatly enlarged cross-sectional view of the logic device implanted by the source implant.
Figure 9:
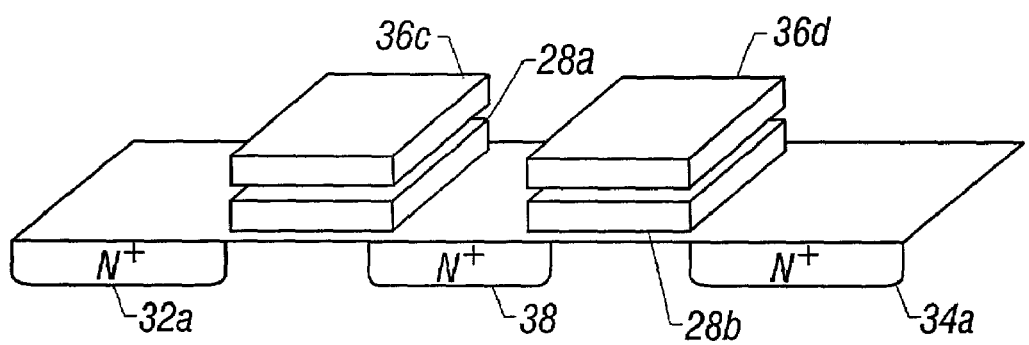
FIG. 9 is a perspective view, corresponding to FIG. 4, of another embodiment of the present invention.

After control gate 36 definition, an N+source/drain implant I₂ may be self-aligned to the control gate in conjunction with the formation of sources in the case of memory devices as shown in FIG. 7 and sources and drains in the case of logic devices as shown in FIG. 8. Thus, the memory control gate 36 forms the gate 88 of the logic devices. At the same time the source region 84 receives the implant I₂ with the drain covered by the mask 86.

A resist on resist process may be used to protect interlayer dielectrics such as oxide-nitride-oxide (ONO) layers and the floating gate from drain implant contamination. The resist used to define the floating gate may be maintained and additional resist may be added to form a composite resist layer 82 to protect logic devices from the memory device drain implant. Advantageously, any additional resist used to form the composite resist 82 is spaced back from the drain edge to prevent any shadowing during the drain implant.

With the completion of these capacitor and transistor structures, all subsequent processing for contacts and interconnect layers follows standard logic rear end processing.

Referring again to FIG. 3, the flow of electron current from the injector, which in the illustrated embodiment is the source 32, to a floating gate 28 b is shown. The substrate electrons, indicated by arrows, may flow from the source 32 along the entire width "W" of the cell between adjacent isolation regions 40. In addition, electrons flow from the portions 32a and 32b extending beyond the cell width. Namely, the portions of the source 32 extending to either side of the cell in the width direction also contribute electrons that may be utilized to program the floating gate 28. This may significantly increase the available electron current for erasing and thus may expedite erasing.

This arrangement is possible because the heavily doped N-type sources 32 and 34 run parallel to the control gates 36. In other words, the sources 32 and 34 run parallel to the word lines or rows of the array. Because of this geometry, a portion of the source that is greater in length than the width of the cell may be utilized for erasing purposes. Namely, additional electrons may flow from the extensions 32a and 32b between adjacent columns of cells.

The operation of one embodiment of the invention is illustrated in the following mode table:

|  | Selected B/L | Unselected B/L | Source 1 | Source 2 | Next to Selected WL | Selected WL |
| --- | --- | --- | --- | --- | --- | --- |
| Erase | H | H | $-V_S$ | $V_H$ | $-V_S$ | $V_{HH}$ |
| Prog. | H | $V_{SS}$ | Float | Float | $V_{SS}$ | $-V_{HH}$ |
| Read | .7–1.0 V | Float | $-V_S$ | $V_{SS}$ | $V_{SS}$ | $V_{HH}$ |
| Flash Erase | H | H | $-V_S$ | $-V_S$ | $V_{HH}$ | $V_{HH}$ |

Figure 4:
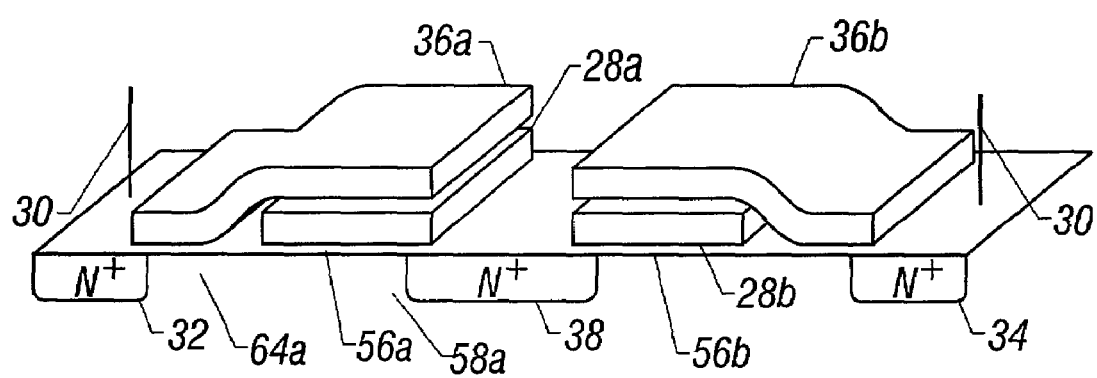
FIG. 4 is a partial three-dimensional view of the cell shown in FIG. 3.

In accordance with another embodiment of the present invention shown in FIGS. 9–12, a self-aligned stacked gate structure may be utilized in accordance with one embodiment of the present invention. In the stacked gate embodiment shown in FIG. 9, a pair of floating gates 28a and 28b may be positioned on either side of a drain 38 and between a pair of spaced apart sources 32a and 34a. Thus, the structure shown in FIG. 9 corresponds to that shown in FIG. 4 with the exception of the substitution of the self-aligned stacked gate structure.

Figure 10:
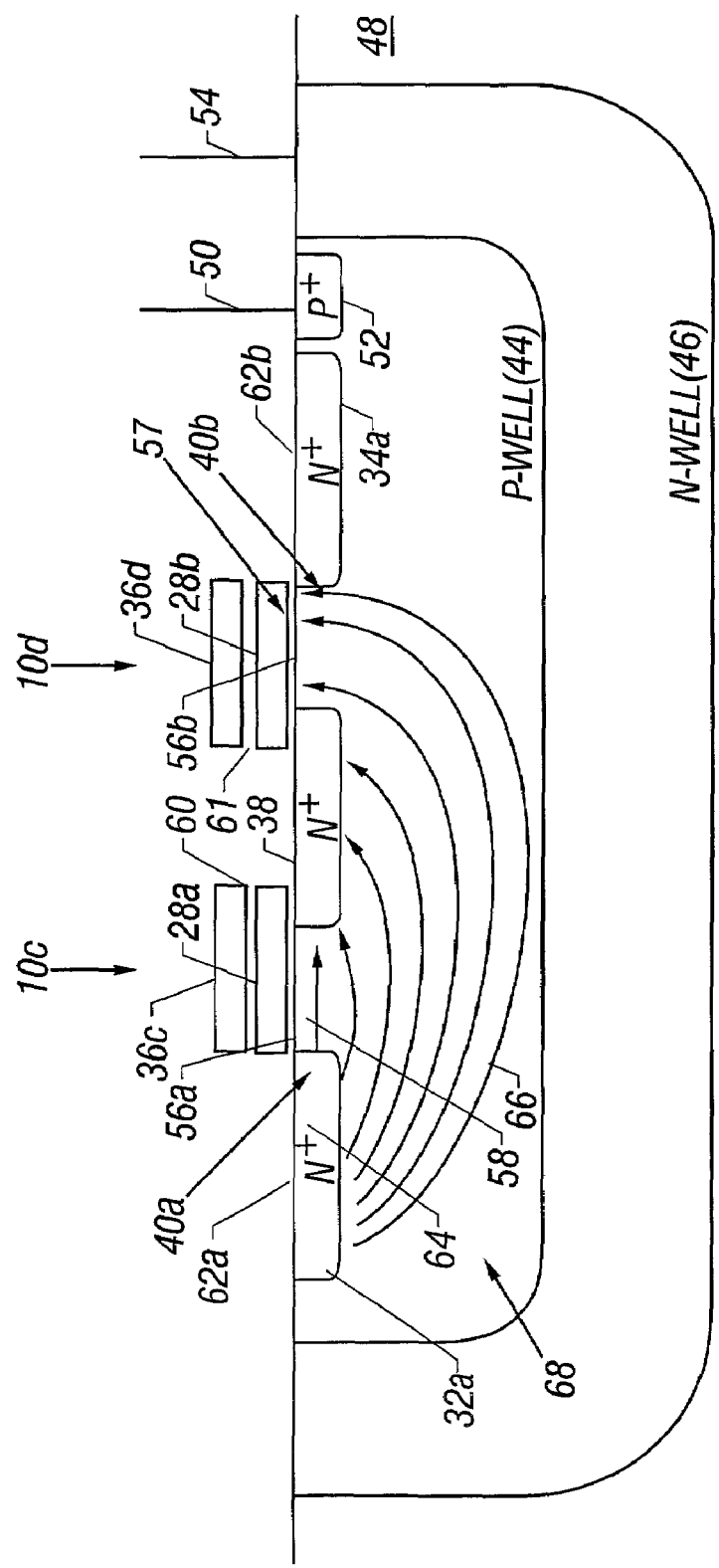
FIG. 10 is an enlarged cross-sectional view taken generally along the line 10—10 in FIG. 11.
Figure 11:
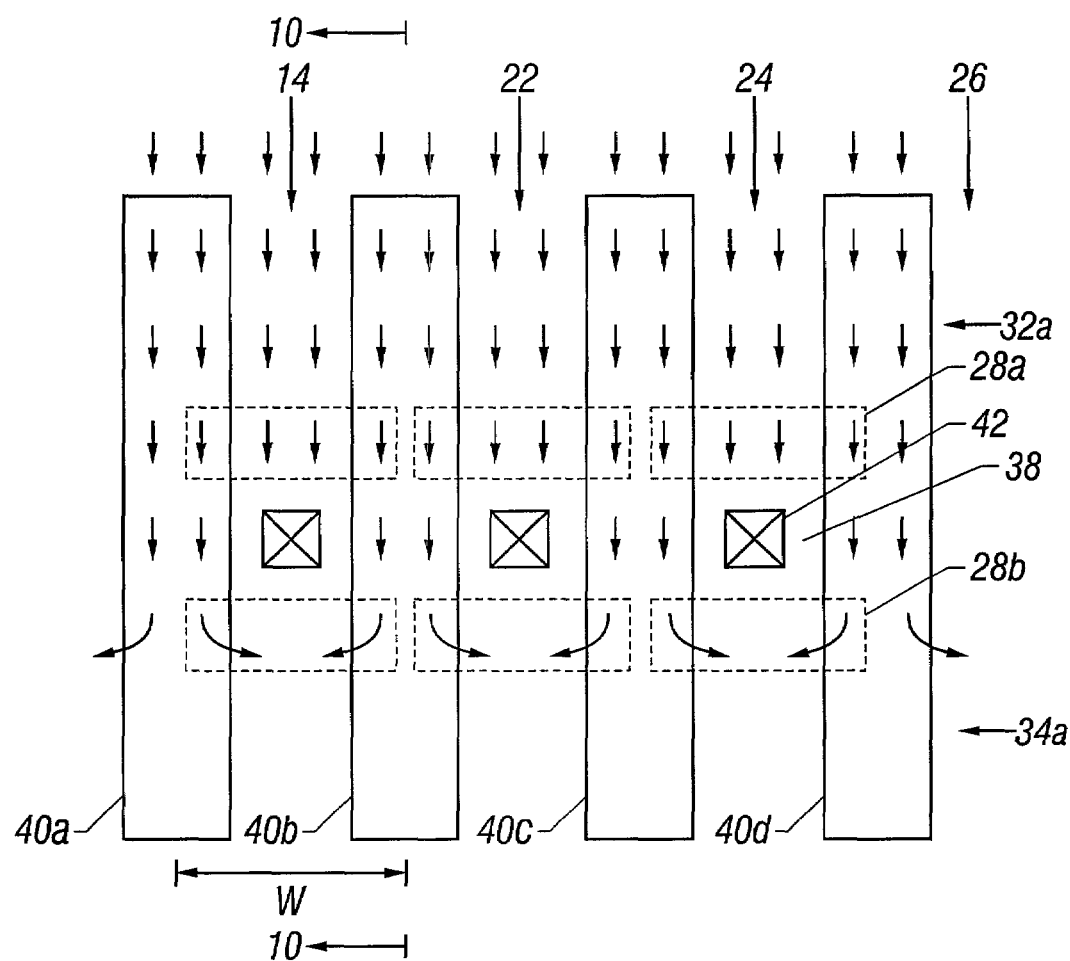
FIG. 11 is a greatly enlarged, top plan view showing a layout of a semiconductor implementation in accordance with one embodiment of the present invention shown in FIGS. 9 and 10.

Referring to FIG. 10, the operation of the stacked gate devices 10c and 10d correspond to those of the stacked gate structures 10a and 10b shown in FIG. 2. Similarly, a top plan view of the embodiment shown in FIG. 10 is provided in FIG. 11. Thus, it can be seen that the electron flow indicated by the arrows proceeds around the drain 38 into the channel 56b underneath the structure 10d.

The stacked gate structure may be advantageous in some embodiments in that the interpoly dielectrics may be more reliable.

Figure 12:
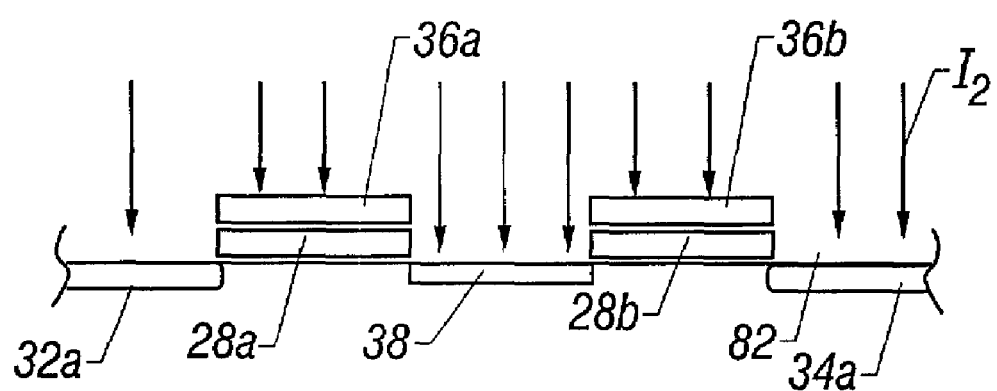
FIG. 12 is a greatly enlarged, cross-sectional view showing the steps of forming the source and drain implants in accordance with one embodiment of the present invention.

Referring to FIG. 12, the sources 32a and 34a and the drain 38 may be formed at the same time in the stacked gate structure. That is, both the sources 32a and 34a, as well as the drain 38a, may be self-aligned to the control gates 36 and may be by the same source drain implant indicated as I2.

While a number of parameters and levels were provided in the foregoing description, those skilled in the art will appreciate that these parameters and levels are merely for illustration purposes. For example, by reversing the conductivity types of the doped junctions and the bias polarities, a cell structure using substrate hot hole injection may be implemented. In addition, charge injection may be used for programming rather than erasing as disclosed in the illustrated embodiment. It is intended that the appended claims cover all modifications and variations as fall within the true spirit and scope of the present invention.

What is claimed is:

1. A method for forming a pair of memory cells capable of functioning as non-volatile memory cells, comprising:
   defining a pair of spaced apart floating gates over a substrate;
   forming a stacked control gate over each floating gate; and
   forming a drain and a pair of sources by implantation using said stacked control gates as a mask, so that substrate electrons are supplied from one of the pair of sources of a first memory cell through an underlying channel of a second memory cell along a path from the one of the pair of sources to the underlying channel, wherein a width of the path is greater than a width of one of the pair of memory cells.

2. The method of claim 1 including using said control gates to protect said floating gates from said implantation.

3. The method of claim 1 including self aligning said sources and drain to both of said control gates.

4. The method of claim 1 including using substrate hot electron injection to charge said floating gates.

5. The method of claim 1, wherein defining a pair of spaced apart floating gates over a substrate includes,
   forming the spaced apart floating gates over a triple well defined within the substrate.

6. The method of claim 1, wherein the pair of spaced apart floating gates are composed of polysilicon.

7. The method of claim 1, wherein the control gate is composed of polysilicon.

8. The method of claim 1, wherein the drain and the pair of sources are formed contemporaneously.

* * * * *